Dec. 5, 1961 W. M. WATERS 3,012,202

JUMP AMPLIFIER CIRCUIT

Filed June 19, 1956

INVENTOR
W. M. WATERS

BY

ATTORNEYS

United States Patent Office 3,012,202

Patented Dec. 5, 1961

3,012,202

JUMP AMPLIFIER CIRCUIT

William M. Waters, Baltimore, Md., assignor to the United States of America as represented by the Secretary of the Navy Filed June 19, 1956, Ser. No. 592,469
4 Claims. (Cl. 328—140)

This invention relates generally to electrical amplifier circuits and more particularly to amplifier circuits having nonlinear frequency response characteristics.

Nonlinear frequency responsive amplifiers exhibiting a substantial instantaneous variation in the amplitude of the output signal at a particular input signal frequency are well-known to those versed in the amplifier art. In general, these, so called jump circuits, utilize an inductance-capacitance resonant circuit containing a nonlinear reactance element. A toroidal inductor wound on a magnetic core exhibiting a rectangular hysteresis characteristic is often used as the nonlinear reactance element. In order to obtain the desired degree of instantaneous amplitude variation, or jump, the inductor is usually biased to a particular level on its magnetization curve by a suitable amount of direct current.

Although the hereinabove described prior art nonlinear reactance jump circuit has been found to operate satisfactorily for most commercial applications, it has not operated entirely satisfactory for certain military applications. For example, the shock of projectile or missile accelerations have produced undesirable changes in the toroidal core magnetic characteristics. Additionally the instantaneous amplitude variation, or jump, have been found inadequate in some ordnance applications, such as fuzes, thereby requiring additional amplification circuitry.

Accordingly, one object of the present invention is to provide a new and improved jump circuit having military operational characteristics superior to those heretofore obtainable.

Another object of the present invention is to provide a new and improved jump circuit utilizing a nonlinear resistance element having superior amplification characteristics.

A further object of the present invention is to provide a new and improved jump circuit.

A still further object of the present invention is to provide a new and improved frequency responsive amplifier circuit.

Other objects and many of the attendant advantages of this invention will be readily appreciated as the same becomes better understood by reference to the following detailed description when considered in connection with the accompanying drawing wherein.

Figure 1:
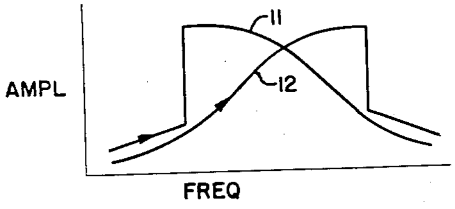
FIG. 1 is a graphical illustration of wave shapes as hereinafter described.

Referring now to the drawing wherein like reference numerals indicate like parts throughout the several views and more particularly to FIG. 1 whereon curves 11 and 12 illustrate jump circuit response characteristics, technically referred to as a soft spring jump and a hard spring jump respectively. As indicated by curve 11, the amplitude of the output signal of a soft spring jump circuit increases linearly until the frequency of the input signal reaches a critical frequency whereupon a large instantaneous increase in the amplitude of the output signal occurs. This rapid variation is referred to as the jump. Additional increase in the input signal frequency results in a gradual decrease in the amplitude of the output signal. The wave shape of curve 12 indicates that a hard spring jump circuit exhibits a reverse response characteristic from the soft spring jump circuit.

Figure 2:
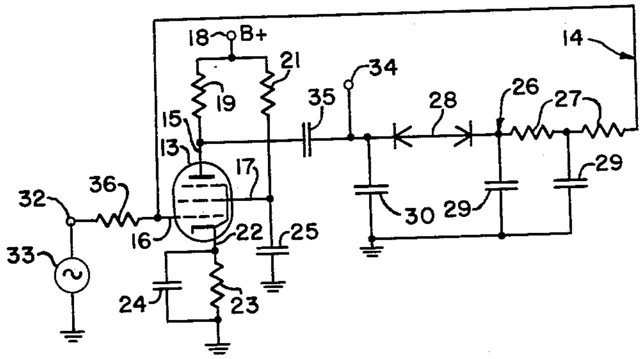
FIG. 2 is a circuit diagram illustrating one arrangement of the inventive circuit having a soft spring characteristic.
Figure 3:
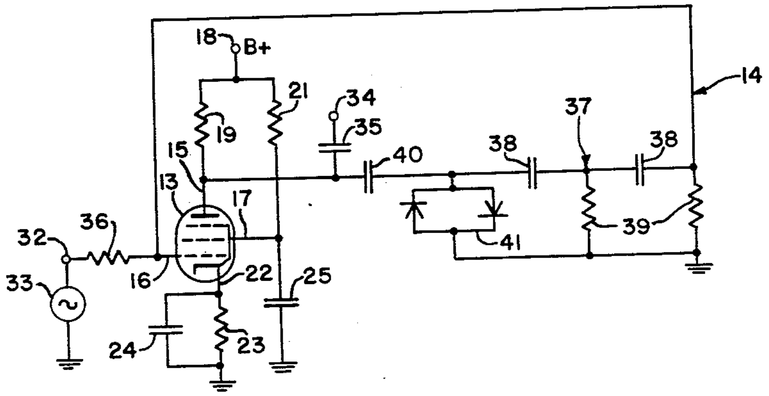
FIG. 3 is a circuit diagram illustrating an alternative arrangement of the inventive circuit having a hard spring characteristic; and, FIG. 4 is a graphical illustration of the nonlinear characteristics of semiconductor diodes as hereafter described.

The schematic diagrams of FIGS. 2 and 3 illustrate, in detail, novel jump circuits having soft spring and hard spring jump characteristics, respectively. Referring more specifically to the circuit of FIG. 2, it may be seen that the soft spring jump circuit includes a conventionally connected electron tube 13, preferably one having a high mutual conductance, and a feedback circuit, generally indicated by the reference numeral 14, connected between the plate 15 and control grid 16 of tube 13. Plate 15 and screen grid 17 are connected to a suitable D.C. potential supply 18 through plate resistor 19 and screen resistor 21 respectively. The cathode 22 is connected through a suitable cathode resistor 23 and cathode bypass condenser 24 to ground. Screen grid 17 is suitably bypassed to ground through condenser 25. The feedback circuit 14 shown on FIG. 2 consists of a multiple section nonlinear R–C phase shift network 26 two sections of which include linear resistors 27 and one section of which includes a nonlinear resistance element 28. Inasmuch as in the network shown, the capacitors 29 and 30 are connected to ground, the network is commonly referred to as a shunt C combination. Each of the individual sections is commonly referred to as an integrating network. The integrating networks are connected in tandem between the input and output of the amplifying tube. The inclusion of a nonlinear resistance element 28, such as two crystal diodes series connected back to back, results in a phase shift through the feedback circuit which changes nonlinearly with the amplitude of the voltage across the nonlinear resistance element in such a manner as to cause the circuit output to exhibit a soft spring jump response.

Figure 4:
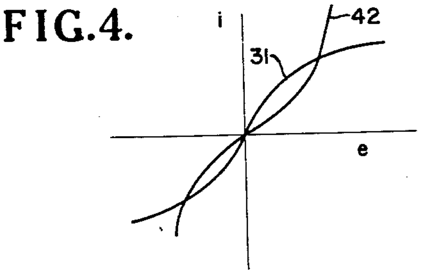

The operation of the nonlinear feedback network will be more readily understood by a consideration of the nonlinear impedance characteristics of the series connected diodes as illustrated by curve 31 of FIG. 4. The curve indicates that in the region above the knee of the curve, the impedance of the series connected diodes increases at a very rapid rate as the amplitude of the voltage applied across them is increased. The effect of this impedance characteristic in the phase-shift network 26 is to increase the time constant of the network section which includes the nonlinear resistance 28 in response to an increase in the amplitude of the voltage across the diodes thereby resulting in a decrease in the resonant frequency of the feedback circuit 14 below the linear resonant frequency of the network. Therefore, since there is a component in the feedback circuit 14 whose effective A.C. resistance varies with the voltage across it, the resultant phase-shift through the network 26 will change with the voltage across the nonlinear resistance element 28. The result is that when the frequency of a variable frequency source, such as an oscillator 33, is applied to input terminal 32 and approaches the resonant frequency of the network 26 the amplitude of the in-phase signal fed back to the tube grid 16 increases. This increases the voltage output of tube 13 until the voltage across the diodes 28 lies on the portion of curve 31 where the effective impedance of the diodes rapidly increases thereby causing an instantaneous pulling of the resonant frequency of the network 26 toward the frequency of the input signal resulting in a sudden increase in the amplitude of the output signal appearing at terminal 34. It may be noted that the nonlinear network 26 is connected to the plate 15 through coupling condenser 35 and that resistor 36 is interposed between the signal source 33 and the feedback circuit 14 as a decoupling device.

FIG. 3 shows a jump circuit exhibiting a hard spring characteristic which circuit is substantially similar to the soft spring jump circuit of FIG. 2 with the exception that the feedback circuit 14 utilizes a shunt-R type nonlinear R–C phase shift network, generally indicated by the reference numeral 37. As shown, the network 37 comprises a pair of linear sections each having a condenser 38 and a linear resistor 39 placed to ground, and a third section having a condenser 40 and a nonlinear resistance element 41 consisting of a pair of semiconductor diodes reversely connected in parallel. Each of the individual sections is commonly referred to as a differentiating network. The differentiating networks are connected in tandem between the input and output of the amplifying tube. The effect of the resistance element consisting of the parallel connected diodes 41 on the frequency response of network 37 is the reverse of the resistance element consisting of the series connected diodes 28 as indicated by the shape of curve 42 of FIG. 4. Curve 42 shows that in the region above the knee of the curve, the effective A.C. impedance of the shunt connected crystal diodes 41 decreases in response to an increase in the applied voltage. This decrease in effective impedance results in an increase in the nonlinear resonant frequency of network 37 above its linear resonant frequency thereby producing a reverse effect from that of the series connected nonlinear element 28 whereupon a hard spring jump occurs in the output signal at terminal 34. It has been found that replacement of a linear resistance element in a linear phase shift network, such as the networks 26 and 37 described herein, by a nonlinear resistance element produces a nonlinear phase-shift network having a resonant frequency characteristic considerably different from that of the linear network. It has been found that the soft spring jump phenomenon occurs when the nonlinear resonant frequency is "pulled" below the linear resonant frequency and the hard spring jump phenomenon occurs when the nonlinear resonant frequency is "pulled" above the linear resonant frequency.

In summary, it may be noted that the novel jump circuit disclosed herein utilizes a nonlinear resistor, which although by itself is frequency independent, acts as the equivalent of the inductor utilized in heretofore devised jump circuits and is free of many of the inherent limitations of the reactance device. The amplifier may be considered what is commonly referred to in the art as a phase shift oscillator circuit having a variable frequency signal applied as an input. The oscillator circuit has the non-linear voltage amplitude, responsive resistance element 28 or 41 connected in the feedback loop.

Obviously many modifications and variations of the present invention are possible in the light of the above teachings. It is therefore to be understood that within the scope of the appended claims the invention may be practiced otherwise than as specifically described.

What is claimed as new and desired to be secured by Letters Patent of the United States is:

1. A non-linear circuit comprising an amplifier having an input and an output, said input connected to a sweep frequency source, a plurality of resistance capacitance phase shifting networks connected in tandem, said networks being connected between said input and said output, a non-linear voltage amplitude responsive resistance means in at least one of said networks for producing an abrupt change in the amplifier output voltage amplitude when a particular critical frequency is applied to said amplifier input.

2. A non-linear circuit comprising a vacuum tube having a cathode, anode and control grid, said control grid connected to a sweep frequency signal source, said cathode being connected to ground through a biasing circuit and said anode being connected through a load resistor to a source of potential, a phase shifting network having input and output terminals and comprising three resistance capacitance networks connected in tandem, said input terminal being connected to said anode, said output terminal being connected to said grid, a non-linear voltage amplitude responsive resistance means in one of said networks for producing an abrupt change in voltage amplitude at said anode when a particular critical frequency is applied to said grid by said said sweep frequency signal source.

3. The circuit of claim 2 wherein each of said networks is an integrating circuit and said resistance means comprises a pair of back-to-back series connected diodes.

4. The circuit of claim 2 wherein each of said networks is a differentiating circuit and said resistance means comprises a pair of diodes reversely connected in parallel.

References Cited in the file of this patent

UNITED STATES PATENTS

| | | |
|---|---|---|
| 2,066,333 | Caruthers | Jan. 5, 1937 |
| 2,097,882 | Hudtwalker | Nov. 2, 1937 |
| 2,125,982 | Belleville | Aug. 9, 1938 |
| 2,161,315 | Rechnitzer | June 6, 1939 |
| 2,173,427 | Scott | Sept. 19, 1939 |
| 2,423,505 | Landon | July 8, 1947 |
| 2,439,245 | Dunn | Apr. 6, 1948 |
| 2,522,124 | Klute | Sept. 12, 1950 |
| 2,730,575 | Hayden-Pigg | Jan. 10, 1956 |
| 2,732,528 | Anderson | Jan. 24, 1956 |